US011275568B2

(12) United States Patent
Pelton et al.

(10) Patent No.: US 11,275,568 B2
(45) Date of Patent: Mar. 15, 2022

(54) GENERATING A SYNCHRONOUS DIGITAL CIRCUIT FROM A SOURCE CODE CONSTRUCT DEFINING A FUNCTION CALL

(71) Applicant: MICROSOFT TECHNOLOGY LICENSING, LLC, Redmond, WA (US)

(72) Inventors: Blake D. Pelton, Redmond, WA (US); Adrian Michael Caulfield, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 10 days.

(21) Appl. No.: 16/247,181

(22) Filed: Jan. 14, 2019

(65) Prior Publication Data
US 2020/0225919 A1 Jul. 16, 2020

(51) Int. Cl.
*G06F 30/33* (2020.01)
*G06F 8/41* (2018.01)
(Continued)

(52) U.S. Cl.
CPC ............... *G06F 8/41* (2013.01); *G06F 8/314* (2013.01); *G06F 30/34* (2020.01)

(58) Field of Classification Search
CPC ............ G06F 13/4068; G06F 13/4265; G06F 13/16; G06F 15/80; G06F 15/76;
(Continued)

(56) References Cited

U.S. PATENT DOCUMENTS

| 5,343,554 A | 8/1994 | Koza et al. |
| 5,416,719 A | 5/1995 | Pribetich |

(Continued)

FOREIGN PATENT DOCUMENTS

| WO | 2016094012 A1 | 6/2016 |
| WO | 2017084104 A1 | 5/2017 |

OTHER PUBLICATIONS

"Final Office Action Issued in U.S. Appl. No. 16/247,250", dated Apr. 13, 2020, 22 Pages.
(Continued)

*Primary Examiner* — Binh C Tat
(74) *Attorney, Agent, or Firm* — David W. Foster; Newport IP, LLC

(57) ABSTRACT

A multi-threaded imperative programming language includes a language construct defining a function call. A circuit implementation for the construct includes a first pipeline, a second pipeline, and a third pipeline. The first hardware pipeline outputs variables to a first queue and outputs parameters for the function to a second queue. The second hardware pipeline obtains the function parameters from the second queue, performs the function, and stores the results of the function in a third queue. The third hardware pipeline retrieves the results generated by the second pipeline from the second queue and retrieves the variables from the first queue. The third hardware pipeline performs hardware operations specified by the source code using the variables and the results of the function. A single instance of the circuit implementation can be utilized to implement calls to the same function made from multiple locations within source code.

20 Claims, 7 Drawing Sheets

(51) Int. Cl.
*G06F 30/34* (2020.01)
*G06F 8/30* (2018.01)

(58) Field of Classification Search
CPC ............. G06F 15/7867; G06F 15/8023; G06F 30/327; G06F 9/52; G06F 12/0862; G06F 12/0875; G06F 30/30; G06F 8/4452; G06F 12/08; G06F 12/0895; G06F 15/17381; G06F 2115/10; G06F 2212/455; G06F 2212/6026; G06F 30/331; G06F 30/392; G06F 8/40; G06F 8/452; G06F 9/3851; G06F 9/3867; G06F 30/00; G06F 30/398; G06F 9/44; G06F 9/45558; G06F 9/522; G06F 9/546; G06F 30/34; G06F 9/45533; G06F 13/4282; G06F 15/7825; G06F 8/41; G06F 9/3009; G06F 1/12; G06F 12/1475; G06F 15/16; G06F 15/17325; G06F 16/9017; G06F 2009/45587; G06F 21/53; G06F 21/556; G06F 21/60; G06F 2221/2143; G06F 3/014; G06F 3/017; G06F 8/43; G06F 9/3885; G06F 9/4881; G06F 9/5044; G06F 11/3628; G06F 11/3648; G06F 13/28; G06F 2115/08; G06F 2119/06; G06F 30/39; G06F 30/394; G06F 9/30087; G06F 9/48; G06F 9/5027; G06F 1/163; G06F 1/206; G06F 1/3228; G06F 1/3234; G06F 1/3243; G06F 1/3287; G06F 12/0802; G06F 12/0813; G06F 12/0848; G06F 12/0864; G06F 12/123; G06F 16/1668; G06F 13/20; G06F 13/364; G06F 13/385; G06F 13/4059; G06F 13/4221; G06F 13/423; G06F 13/4286; G06F 15/167; G06F 15/17331; G06F 15/82; G06F 15/825; G06F 16/245; G06F 16/2455; G06F 16/33; G06F 2009/45595; G06F 2117/08; G06F 2200/1636; G06F 2203/0331; G06F 2203/0337; G06F 2203/0339; G06F 2203/0382; G06F 2203/0384; G06F 2209/505; G06F 2209/507; G06F 2209/509; G06F 2213/0016; G06F 2213/0024; G06F 2213/0026; G06F 2213/0042; G06F 2213/4004; G06F 3/016; G06F 3/0236; G06F 3/03547; G06F 3/038; G06F 3/0383; G06F 3/0608; G06F 3/0644; G06F 3/0683; G06F 30/32; G06F 30/323; G06F 30/343; G06F 7/14; G06F 8/34; G06F 8/427; G06F 8/443; G06F 9/00; G06F 9/22; G06F 9/30043; G06F 9/30123; G06F 9/38; G06F 9/3869; G06F 9/3871; G06F 9/3877; G06F 9/3895; G06F 9/4843; G06F 9/485; G06F 9/544; G06F 11/2005; G06F 11/2007; G06F 11/3013; G06F 11/3055; G06F 11/3093; G06F 11/3466; G06F 12/0811; G06F 13/24; G06F 15/8015; G06F 2009/45579; G06F 2009/45583; G06F 21/602; G06F 21/606; G06F 21/64; G06F 21/85; G06F 2115/06; G06F 2201/88; G06F 2209/485; G06F 2212/1016; G06F 2212/45; G06F 8/314; G06F 9/3834; G06F 9/3838; G06F 9/3897; H01L 23/528; H01L 27/105; H01L 27/0207; H01L 27/11807; G01R 31/318357; G01R 31/31704

USPC .................................................. 716/110–117
See application file for complete search history.

(56) References Cited

U.S. PATENT DOCUMENTS

| | | |
|---|---|---|
| 5,642,304 A | 6/1997 | Simpson |
| 5,761,483 A | 6/1998 | Trimberger |
| 5,909,572 A | 6/1999 | Thayer et al. |
| 6,061,521 A | 5/2000 | Thayer et al. |
| 6,112,019 A | 8/2000 | Chamdani et al. |
| 6,212,601 B1 | 4/2001 | Shiell |
| 6,275,508 B1 | 8/2001 | Aggarwal et al. |
| 6,597,664 B1 | 7/2003 | Mithal et al. |
| 7,028,281 B1 | 4/2006 | Agrawal et al. |
| 7,111,273 B1 | 9/2006 | Ganesan et al. |
| 7,203,718 B1 | 4/2007 | Fu et al. |
| 7,305,582 B1 | 12/2007 | Moser et al. |
| 7,315,991 B1 * | 1/2008 | Bennett .................. G06F 30/30 716/103 |
| 7,375,550 B1 | 5/2008 | Redgrave et al. |
| 7,386,820 B1 | 6/2008 | Koelbl et al. |
| 7,415,681 B2 | 8/2008 | Tomar et al. |
| 7,471,104 B1 | 12/2008 | Chirania |
| 7,516,446 B2 | 4/2009 | Choi et al. |
| 7,647,567 B1 | 1/2010 | Esposito et al. |
| 7,735,047 B1 | 6/2010 | Anderson et al. |
| 7,735,050 B2 | 6/2010 | Yu et al. |
| 7,823,117 B1 | 10/2010 | Bennett |
| 7,844,924 B2 | 11/2010 | Sasao et al. |
| 8,095,508 B2 | 1/2012 | Chamberlain et al. |
| 8,209,580 B1 | 6/2012 | Varnica et al. |
| 8,468,510 B1 | 6/2013 | Sundararajan et al. |
| 8,599,049 B2 | 12/2013 | Wang et al. |
| 8,620,881 B2 | 12/2013 | Chamberlain et al. |
| 8,656,347 B2 | 2/2014 | Ito |
| 8,671,371 B1 | 3/2014 | Dimond |
| 8,775,986 B1 | 7/2014 | Mohan et al. |
| 8,881,079 B1 * | 11/2014 | Pan .................... G06F 30/3312 716/111 |
| 8,930,926 B2 | 1/2015 | Bastoul et al. |
| 9,471,307 B2 | 10/2016 | Giroux et al. |
| 9,690,278 B1 | 6/2017 | Chen et al. |
| 9,824,756 B2 | 11/2017 | Brand et al. |
| 9,846,623 B2 | 12/2017 | Jennings et al. |
| 9,858,373 B2 | 1/2018 | Cho et al. |
| 10,162,918 B1 | 12/2018 | Iyer et al. |
| 10,331,836 B1 | 6/2019 | Hosangadi et al. |
| 10,419,338 B2 | 9/2019 | Gray |
| 10,474,533 B2 | 11/2019 | Jennings et al. |
| 2002/0080174 A1 | 6/2002 | Kodosky et al. |
| 2003/0154466 A1 | 8/2003 | Snider |
| 2005/0050531 A1 | 3/2005 | Lee |
| 2006/0075180 A1 | 4/2006 | Tian et al. |
| 2006/0120189 A1 | 6/2006 | Beerel et al. |
| 2006/0268939 A1 | 11/2006 | Dries et al. |
| 2007/0094474 A1 | 4/2007 | Wilson et al. |
| 2007/0143717 A1 | 6/2007 | Koelbl et al. |
| 2007/0171101 A1 | 7/2007 | Siemers et al. |
| 2007/0174804 A1 | 7/2007 | Sasao et al. |
| 2007/0180334 A1 | 8/2007 | Jones et al. |
| 2007/0300192 A1 | 12/2007 | Curtin et al. |
| 2008/0005357 A1 | 1/2008 | Malkhi et al. |
| 2008/0075278 A1 | 3/2008 | Gaubatz et al. |
| 2008/0111721 A1 | 5/2008 | Reznik |
| 2008/0111722 A1 | 5/2008 | Reznik |
| 2008/0229141 A1 | 9/2008 | Chang et al. |
| 2008/0313579 A1 | 12/2008 | Larouche et al. |
| 2009/0210412 A1 | 8/2009 | Oliver et al. |
| 2009/0243732 A1 | 10/2009 | Tarng et al. |
| 2010/0162049 A1 | 6/2010 | Stall et al. |
| 2011/0078640 A1 | 3/2011 | Bruneel |
| 2012/0065956 A1 | 3/2012 | Irturk et al. |
| 2013/0013301 A1 | 1/2013 | Subbaraman et al. |
| 2013/0054939 A1 | 2/2013 | Felch |
| 2013/0081060 A1 | 3/2013 | Otenko |
| 2013/0100750 A1 | 4/2013 | Ishiguro et al. |

(56) References Cited

U.S. PATENT DOCUMENTS

| | | | |
|---|---|---|---|
| 2013/0111425 A1 | 5/2013 | Kumar et al. | |
| 2013/0111453 A1 | 5/2013 | Kalogeropulos et al. | |
| 2013/0125097 A1* | 5/2013 | Ebcioglu | G06F 8/4452 717/136 |
| 2013/0139122 A1 | 5/2013 | Pell et al. | |
| 2013/0212365 A1 | 8/2013 | Chen et al. | |
| 2013/0226594 A1 | 8/2013 | Fuchs et al. | |
| 2013/0298130 A1 | 11/2013 | Pienaar et al. | |
| 2013/0335853 A1 | 12/2013 | Li et al. | |
| 2014/0059524 A1 | 2/2014 | Kee et al. | |
| 2014/0237437 A1 | 8/2014 | Mang et al. | |
| 2015/0052298 A1 | 2/2015 | Brand et al. | |
| 2015/0178418 A1* | 6/2015 | Gu | G06F 30/3323 716/107 |
| 2015/0178435 A1 | 6/2015 | Kumar | |
| 2015/0295552 A1 | 10/2015 | Abou-Chahine et al. | |
| 2015/0304068 A1 | 10/2015 | Xiong et al. | |
| 2016/0087651 A1 | 3/2016 | Lu | |
| 2016/0180001 A1* | 6/2016 | Adler | G06F 13/42 716/138 |
| 2016/0246571 A1 | 8/2016 | Walters | |
| 2016/0259023 A1 | 9/2016 | Overall et al. | |
| 2016/0299998 A1 | 10/2016 | Isshiki | |
| 2016/0344629 A1 | 11/2016 | Gray | |
| 2017/0140513 A1 | 5/2017 | Su et al. | |
| 2017/0185508 A1 | 6/2017 | Looney et al. | |
| 2017/0192921 A1 | 7/2017 | Wang et al. | |
| 2017/0251211 A1 | 8/2017 | Froehlich et al. | |
| 2017/0277656 A1 | 9/2017 | John et al. | |
| 2017/0315815 A1 | 11/2017 | Smith | |
| 2017/0316154 A1 | 11/2017 | Fitch et al. | |
| 2018/0129475 A1 | 5/2018 | Almagambetov et al. | |
| 2018/0143872 A1 | 5/2018 | Sun et al. | |
| 2018/0232475 A1 | 8/2018 | Derisavi et al. | |
| 2018/0253368 A1 | 9/2018 | Villarreal et al. | |
| 2018/0255206 A1 | 9/2018 | Kim et al. | |
| 2018/0330022 A1 | 11/2018 | Choi et al. | |
| 2018/0342040 A1 | 11/2018 | Nguyen et al. | |
| 2018/0347498 A1 | 12/2018 | Maloney | |
| 2019/0114548 A1 | 4/2019 | Wu et al. | |
| 2019/0138365 A1 | 5/2019 | Purnell et al. | |
| 2019/0286973 A1 | 9/2019 | Kovvuri et al. | |
| 2019/0303153 A1 | 10/2019 | Halpern et al. | |
| 2020/0167139 A1 | 5/2020 | Drepper | |
| 2020/0225920 A1 | 7/2020 | Pelton et al. | |
| 2020/0225921 A1 | 7/2020 | Pelton et al. | |
| 2020/0226051 A1 | 7/2020 | Pelton et al. | |
| 2020/0226227 A1 | 7/2020 | Pelton et al. | |
| 2020/0226228 A1 | 7/2020 | Pelton et al. | |
| 2021/0049163 A1 | 2/2021 | Levy et al. | |

OTHER PUBLICATIONS

"International Search Report and Written Opinion Issued in PCT Application No. PCT/US2019/069030", dated Mar. 27, 2020, 11 Pages.

"Operand Forwarding", Retrieved From: https://en.wikipedia.org/w/index.php?title=Operand_forwarding&oldid=868126536, Retrieved on: Nov. 10, 2018, 2 Pages.

"Register File", Retrieved From: https://en.wikipedia.org/w/index.php?title=Register_file&oldid=923242007, Retrieved on: Oct. 27, 2019, 8 Pages.

"Re-order Buffer", Retrieved From: https://en.wikipedia.org/w/index.php?title=Re-order_buffer&oldid=928835149 Retrieved on: Dec. 1, 2019, 1 Page.

"Non-Final Office Action Issued in U.S. Appl. No. 16/247,250", dated Dec. 27, 2019, 14 Pages.

"Ex Parte Quayle Action Issued in U.S. Appl. No. 16/247,261", dated Feb. 4, 2020, 7 Pages.

"Non Final Office Action Issued in U.S. Appl. No. 16/247,269", dated Feb. 20, 2020, 14 Pages.

Cong, et al., "Combinational Logic Synthesis for LUT Based Filed Programmable Gate Arrays", In Proceedings of the ACM Transactions on Design Automation of Electronic Systems, Apr. 1996, pp. 145-204.

Tan, et al., "Mapping-Aware Constrained Scheduling for LUT-Based FPGAs", In Proceedings of the ACM/SIGDA International Symposium on Field-Programmable Gate Arrays, Feb. 22, 2015, 10 Pages.

Ditmar, et al., "Function Call Optimisation in SystemC Hardware Compilation", In Proceedings of 4th Southern Conference on Programmable Logic, Mar. 26, 2008, pp. 93-98.

"International Search Report and Written Opinion Issued in PCT Application No. PCT/US2019/069028", dated Apr. 24, 2020, 13 Pages.

"International Search Report and Written Opinion Issued in PCT Application No. PCT/US2019/069028", dated May 4, 2020, 13 Pages.

"International Search Report and Written Opinion Issued in PCT Application No. PCT/US2019/069032", dated Apr. 24, 2020, 13 Pages.

"International Search Report and Written Opinion Issued in PCT Application No. PCT/US2020/012278", dated Apr. 6, 2020, 15 Pages.

"Final Office Action Issued in U.S. Appl. No. 16/247,269", dated Oct. 16, 2020, 15 Pages.

"Non Final Office Action Issued in U.S. Appl. No. 16/247,226", dated Sep. 4, 2020, 33 Pages.

"Non-Final Office Action Issued in U.S. Appl. No. 16/247,203", dated Nov. 9, 2020, 8 Pages.

"Non Final Office Action Issued in U.S. Appl. No. 16/247,250", dated Nov. 12, 2020, 18 Pages.

Arar, Steve, "Concurrent Conditional and Selected Signal Assignment in VHDL", https://www.allaboutcircuits.com/technical-articles/concurrent-conditional-and-selected-signal-assignment-in-vhdl/, Jan. 3, 2018, 8 Pages.

Galloway, et al., "The Transmogrifier C hardware description language and compiler for FPGAs", In Proceedings IEEE Symposium on FPGAs for Custom Computing Machines, Apr. 19, 1995, pp. 136-144.

"International Search Report and Written Opinion Issued in PCT Application No. PCT/US2019/069034", dated Jun. 23, 2020, 19 Pages.

"Notice of Allowance Issued in U.S. Appl. No. 16/247,250", dated Apr. 14, 2021, 25 Pages.

Hatami, et al., "High Performance Architecture for Flow-Table Lookup in SDN on FPGA", In Repository of arXiv:1801.00840, Jan. 2, 2018, 15 Pages.

"Final Office Action Issued in U.S. Appl. No. 16/247,203", dated Apr. 1, 2021, 6 Pages.

"Final Office Action Issued in U.S. Appl. No. 16/247,226", dated Mar. 18, 2021, 41 Pages.

"Notice of Allowance Issued in U.S. Appl. No. 16/247,226", dated Jun. 25, 2021, 14 Pages.

Steinberg, et al., "Automatic High-level Programs Mapping onto Programmable Architectures", In Proceedings of International Conference on Parallel Computing Technologies, Jul. 25, 2015, pp. 474-485.

"Notice of Allowance Issued in U.S. Appl. No. 16/247,203", dated Jun. 3, 2021, 8 Pages.

* cited by examiner

GENERATING A SYNCHRONOUS DIGITAL CIRCUIT FROM A SOURCE CODE CONSTRUCT DEFINING A FUNCTION CALL

BACKGROUND

Hardware description languages ("HDLs") are modeling languages used by hardware engineers to describe the structure and behavior of electronic circuits, most commonly digital logic circuits. Examples of HDLs include Very High Speed Integrated Circuit ("VHSIC") HDL and VERILOG.

HDLs commonly require many lines of code to model digital logic circuits. Even for hardware engineers that are very familiar with HDLs, creation of such code can be extremely time consuming. Moreover, the more lines of code present in a design, the more likely it is for the design to include errors or perform poorly.

Additionally, because HDLs typically utilize a different programming paradigm than imperative programming languages, software engineers that are not intimately familiar with HDLs commonly have a very difficult time utilizing these languages. As a result, electronic circuits generated from HDL created by software engineers can also include errors or perform poorly.

C to HDL tools exist that can convert C-language or C-like program code into HDLs, like VHSIC or VERILOG. There are, however, certain types of programming language constructs that these tools inefficiently implement in hardware. For example, these tools typically create multiple instances of the same hardware when implementing a function that is called from multiple locations in program source code. This results in the inefficient use of limited hardware resources and can result in poor performance.

It is with respect to these and other technical challenges that the disclosure made herein is presented.

SUMMARY

Technologies are disclosed for generating a synchronous digital circuit ("SDC") from a source code construct defining a function call. Through implementations of the disclosed technologies, a SDC can be generated that includes a single instance of hardware for implementing a function called from multiple locations in program source code. This results in more efficient utilization of available hardware, such as when the SDC is implemented in a field-programmable gate array ("FPGA"), as compared to C to HDL tools. Other technical benefits not specifically mentioned herein can also be realized through implementations of the disclosed subject matter.

In order to realize the technical benefits mentioned briefly above, program source code is generated in a multi-threaded imperative programming language and stored. The programming language is imperative in that program statements are executed one after another, and multi-threaded in that multiple threads of execution can be executing in parallel. A thread refers to a collection of local variables that are executed as the local variables are processed by a hardware circuit.

The multi-threaded imperative programming language includes language constructs (or "constructs") that map to circuit implementations. A language construct is a syntactically allowable part of a program that may be formed from one or more lexical tokens. The circuit implementations can be implemented as a SDC in a FPGA, a Gate Array, an Application-Specific Integrated Circuit ("ASIC"), or another type of suitable device. Another hardware component, such as a network interface card ("NIC"), can be configured with the FPGA, gate array, or ASIC, in order to implement desired functionality.

In one configuration, the multi-threaded imperative programming language includes a language construct that defines a function call (which might be referred to herein as a "function call construct"). This construct maps to a circuit implementation for implementing the function call in hardware. The construct can identify the function call and one or more input parameters for the function (referred to herein as "function parameters"). The same construct can be utilized to enable a called function to call other functions.

The circuit implementation corresponding to the function call construct includes a first hardware pipeline. The first hardware pipeline can implement statements located before the function call in the program source code. The first hardware pipeline outputs variables to a first queue and outputs parameters for the function (which might be referred to herein as "function parameters") to a second queue.

The circuit implementation corresponding to the function call construct also includes a second hardware pipeline that obtains the function parameters from the second queue. The second hardware pipeline also includes hardware for implementing the function itself. For example, the second hardware pipeline might implement the function by performing operations on the function parameters and/or other values. The second hardware pipeline stores results generated by performance of the function in a third queue.

The circuit implementation for the function call construct also includes a third hardware pipeline. The third hardware pipeline implements statements located after the function call in the program source code. The third hardware pipeline can retrieve the results generated by the second pipeline from the second queue. The third hardware pipeline can also retrieve the variables stored by the first hardware pipeline from the first queue. The third hardware pipeline can perform hardware operations specified by the source code using the variables and the results of the function.

In some configurations, the circuit implementation can include hardware for implementing function invocations from multiple locations within program source code. In these configurations, the circuit implementation for the function call can include a fourth hardware pipeline. The fourth hardware pipeline can implement statements located before a second function call in the program source code. The fourth hardware pipeline outputs second variables to a fourth queue and outputs second function parameters to a fifth queue. In these configurations, the second hardware pipeline (i.e. the pipeline implementing the function) can receive the second function parameters from the fifth queue and perform the specified function using the second function parameters. The second hardware pipeline can then store the results of the function in a sixth queue.

A fifth hardware pipeline can implement statements located after the second function call in the program source code. The fifth hardware pipeline can retrieve the results generated by the second pipeline from the sixth queue. The fifth hardware pipeline can also retrieve the second variables stored by the fourth hardware pipeline in the fourth queue.

The fifth hardware pipeline can then perform operations specified by the source code using the second variables and the results of the performance of the function using the second function parameters. In these configurations, the second hardware pipeline can utilize a hidden parameter to determine whether results are to be stored in the third queue (i.e. for consumption by the third pipeline) or the sixth queue (i.e. for consumption by the fifth pipeline).

Once program source code has been defined that includes a construct that maps to a circuit implementation for a function, the source code, including the construct, can be compiled to generate a circuit description. The circuit description can be expressed using HDL, for instance. The circuit description can, in turn, be used to generate an SDC that includes the circuit implementation. For example, HDL might be utilized to generate an FPGA image or bitstream that includes the circuit implementation defined by the construct. The FPGA image or bitstream can, in turn, be utilized to program an FPGA that includes the circuit implementation.

As discussed briefly above, implementations of the technologies disclosed herein enable more efficient utilization of available hardware when implementing functions as compared to previous solutions such as, for instance, C to HDL tools. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
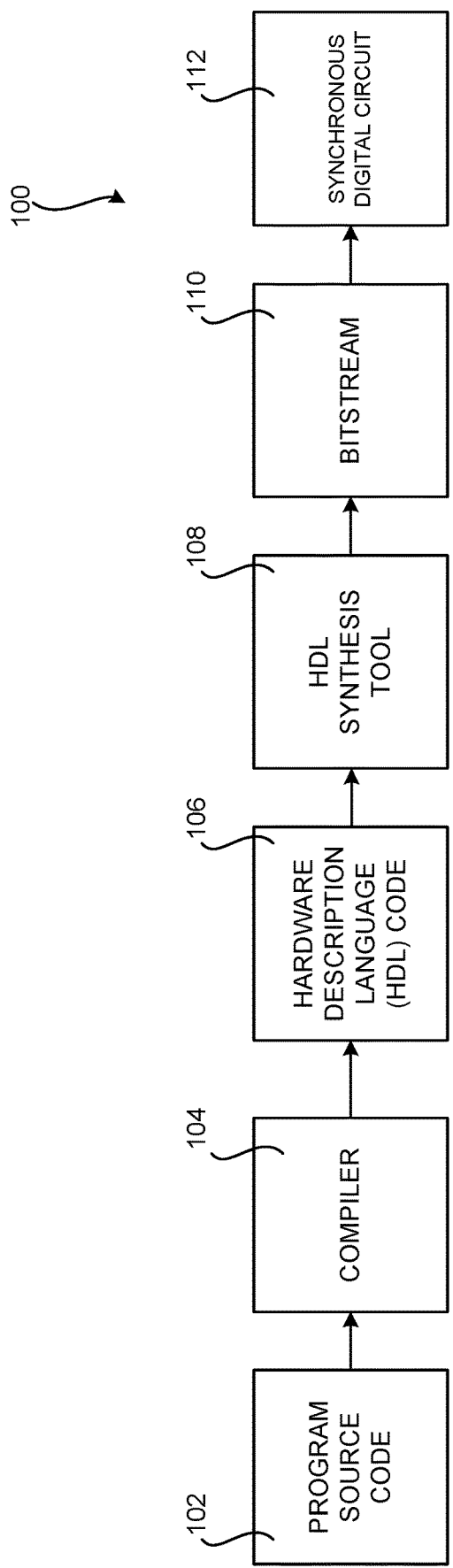
FIG. 1 is a computing architecture diagram that shows aspects of a system disclosed herein for generating a synchronous digital circuit based on program source code that includes a programming construct defining a function call.

The following detailed description is directed to technologies for generating a SDC based on a source code construct that defines a function. As discussed briefly above, implementations of the technologies disclosed herein enable a SDC to be generated that includes a single instance of hardware for implementing a software-defined function that is called from multiple locations in program source code. This results in more efficient utilization of available hardware, such as when the SDC is implemented in a FPGA for instance, as compared to C to HDL tools. Other technical benefits not specifically mentioned herein can also be realized through implementations of the disclosed subject matter.

While the subject matter described herein is presented in the general context of a computing system executing a compiler configured for compiling source code language constructs that map to circuit implementations, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of various technologies for generating a SDC from a source code construct that defines a function will be described.

FIG. 1 is a computing architecture diagram that shows aspects of an illustrative system 100 disclosed herein for defining and generating a SDC 112 based on program source code 102 that includes a programming construct defining a function call. As discussed briefly above, SDCs 112 can be implemented by Gate Arrays, FPGAs, ASICs, and other types of circuit devices. While the disclosed subject matter is primarily described in the context of an SDC 112 implemented in an FPGA, it is to be appreciated that the technologies disclosed herein can be utilized to define SDCs 112 that are implemented using other types of devices.

As illustrated in FIG. 1, the illustrative system 100 includes a compiler 104 that compiles program source code 102 to generate hardware description language ("HDL") code 106 or a lower-level representation of a circuit, such as a netlist. As discussed briefly above, HDLs are modeling languages used by hardware engineers to describe the structure and behavior of electronic circuits, most commonly digital logic circuits. Examples of HDLs include VHSIC HDL and VERILOG.

The program source code 102 is expressed using a multi-threaded imperative programming language designed to target SDCs 112. The disclosed language provides many of the features of languages such as 'C' and 'JAVA, such as function calls, for-loops, arithmetic operators, and conditional statements. However, the disclosed language includes constructs that map directly to an underlying SDC 112 hardware implementation. This enables both hardware and software engineers to reason about performance, and to be effective in optimizing their designs. This can also make the language familiar to software engineers, and free hardware engineers from dealing with whole classes of bugs that arise when coding in an HDL.

The disclosed multi-threaded imperative programming language is imperative in that program statements are executed one after another, and multi-threaded in that multiple threads of execution can be executing in parallel. As discussed above, a thread is a collection of variables that are executed as the variables are processed by a hardware circuit.

The threads described herein are analogous to, yet different, from software threads. While a software thread maintains a call stack containing variables and executes code in memory, the threads described herein are collections of variables that move through hardware circuits. While a software thread has a location in executable code determined by an instruction pointer, the disclosed thread has a physical location on the SDC at a given point in time. SDCs may execute hundreds, thousands, or even millions of threads, and SDC execution may be pipelined—i.e. different threads may execute within different stages of a circuit at the same time.

As will be described in greater detail below, language constructs can be defined in the program source code 102 that map to a circuit implementation. A language construct is a syntactically allowable part of a program that may be formed from one or more lexical tokens. The language constructs described herein map to circuit implementations that guarantee thread ordering (i.e. that threads will exit a circuit implementation in the same order that they entered).

As will also be described in greater detail below, the circuit implementations generated by the constructs disclosed herein can be implemented as an SDC in an FPGA, a Gate Array, an ASIC, or another type of suitable device. Another hardware component, such as a NIC, can be configured with the FPGA, Gate Array, or ASIC, in order to implement desired functionality.

As shown in FIG. 1, a compiler 104 can compile the program source code 102 including one or more of the language constructs disclosed herein to a circuit description, HDL code 106 in this example. The HDL code 106 can be provided to an HDL synthesis tool 108 which, in turn, can generate a bitstream 110 that can be utilized to generate an SDC 112, such as for instance on an FPGA. When targeting an ASIC, the HDL code 106 can be provided to an ASIC fabricator for production in a factory.

Figure 2:
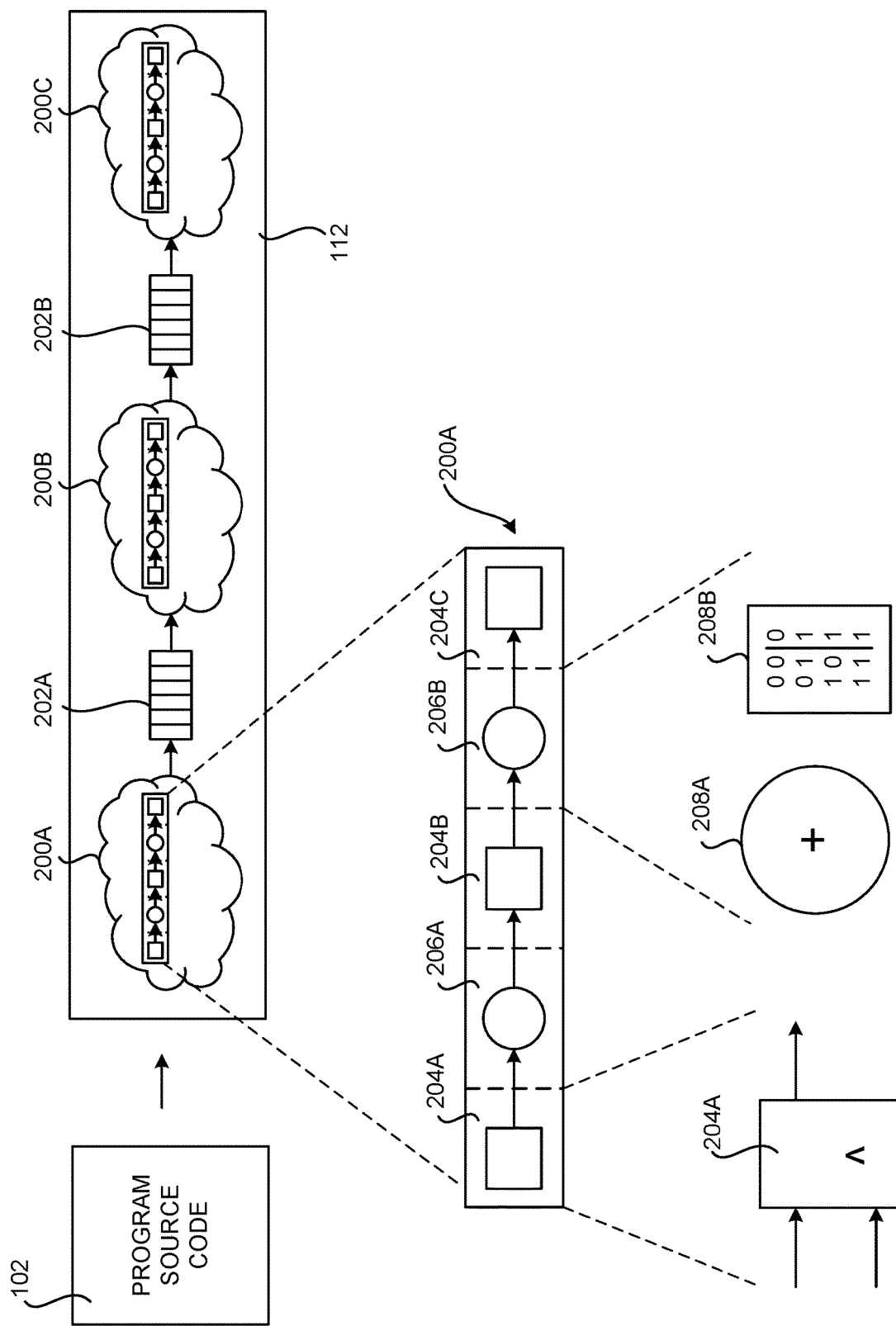
FIG. 2 is a hardware architecture diagram showing aspects of an illustrative example synchronous digital circuit that includes several hardware pipelines, each having multiple pipeline stages, and computational units that can be defined and implemented using the disclosed technologies.

FIG. 2 is a hardware architecture diagram showing aspects of an illustrative example SDC 112 that includes several hardware pipelines 200A-200C (or "pipelines") that can be defined and implemented using the disclosed technologies. Each hardware pipeline has multiple pipeline stages 206, each of which has computational units 208. As shown in FIG. 2, the program source code 102 can be compiled into pipelines 200A-200C of hardware computational units 208.

The pipelines 200A-200C can be connected by first-in-first-out ("FIFO") queues (which might be referred to herein as "FIFOs" or "queues"). The pipelines 200A-200C implement the functionality defined by the program source code 102. The FIFOs 202 store data values, providing input to pipelines 200 as well as storing output generated by pipelines 200. For example, the SDC 112 includes a pipeline 200A that feeds its output to the FIFO 202A. Pipeline 200B, in turn, obtains its input from the FIFO 202A and provides its output to the FIFO 202B. The pipeline 200C obtains its input from the FIFO 202B.

In some configurations, the pipelines 200 implement circuitry that determines when to retrieve the next value(s) from a FIFO 202. For example, a policy may require that an input FIFO (e.g. the FIFO 202A in the case of the pipeline 200B) is not empty and an output FIFO (e.g. the FIFO 202B) is not full before retrieving a value from the input FIFO (e.g. the FIFO 202A) for processing.

As shown in FIG. 2, a pipeline 200 may consist of one or more pipeline stages 206A-206B. Execution is pipelined by executing different threads in different stages 206 of a pipeline 200 concurrently. The results of stages can be stored in registers 204 and provided to the next stage 206 for the duration of the next clock cycle.

Each pipeline stage 206 can include one or more computational units 208, such as adder 208A and lookup table ("LUT") 208B. In the illustrated example, adder 208A can perform basic arithmetic, e.g. addition, subtraction, or multiplication. Computational units can also implement Boolean operators (e.g. "OR", "NOR", "XOR", etc.) or other custom logic provided by the SDC manufacturer.

Computational units can also be implemented by user-programmable lookup tables 208B. The illustrated LUT 208B depicts a two-input truth table that maps two input bits to a single output bit. LUTs 208B can be configured to support different numbers of input bits. To generate more complex output values, e.g. characters or 8-bit integers, multiple LUTs 208B, each connected to a different bit of an input variable, may be used.

Computational units can temporarily store results in registers 204 (or "flip-flops"). The contents of such a register can be provided to other computation units in the same or different pipeline 200. Registers 204 can capture a value at an input when a connected digital clock transitions from 0 to 1, and provide that value at an output until the end of the next clock cycle (i.e. until the clock transitions from 0 to 1 again). Registers can also include an enable line. If an enable line is set to false, then the register will not perform the operations described above, maintaining the current output value over multiple clock cycles.

It is to be appreciated that the pipeline architecture shown in FIG. 2 has been simplified for discussion purposes. The programming language constructs described herein can be utilized to implement much more complex SDCs 112 that include many more components than illustrated in FIG. 2.

Figure 3A:
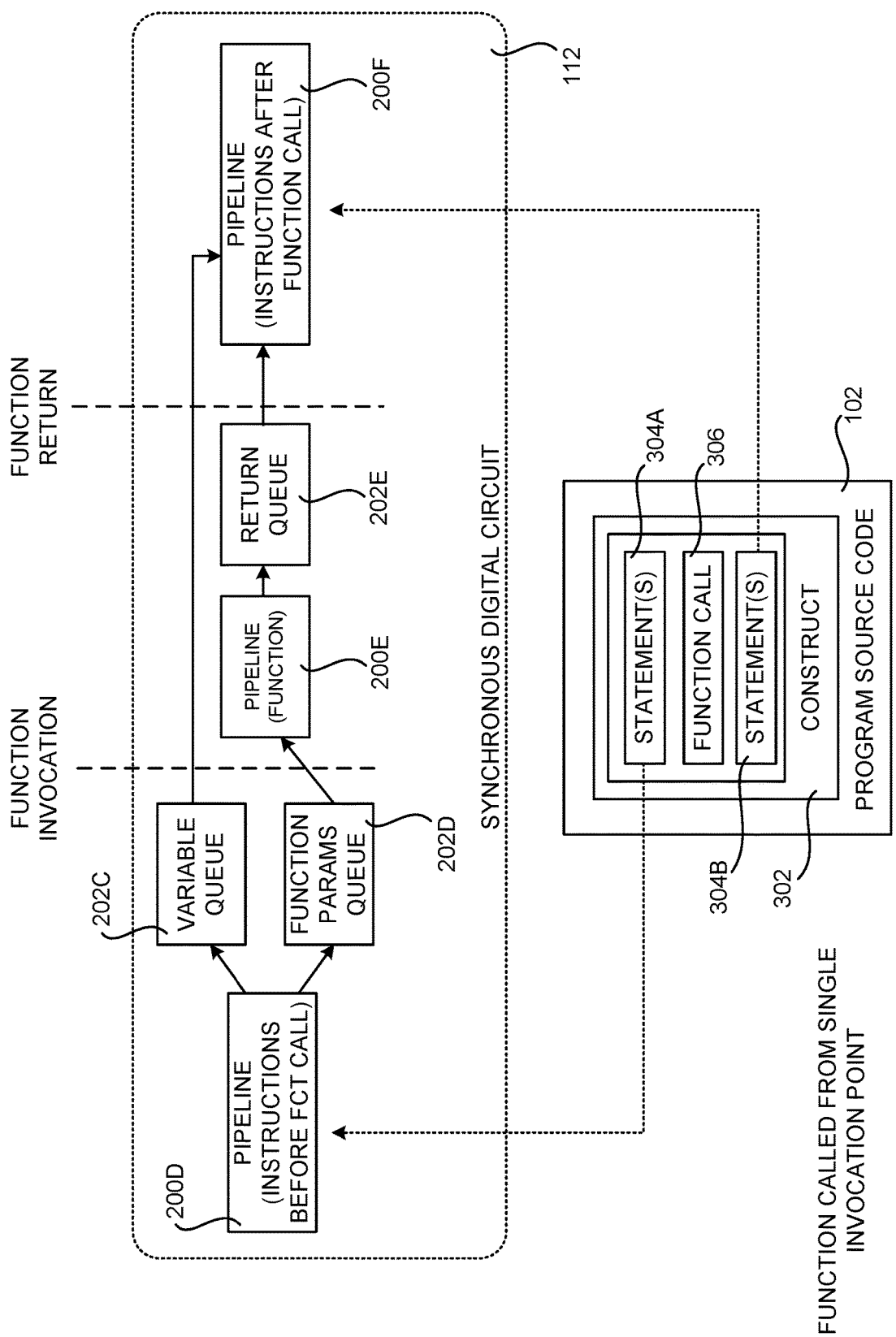
FIG. 3A is a hardware architecture diagram that shows aspects of an illustrative synchronous digital circuit generated from a source code that includes a language construct that defines a function call.

FIG. 3A is a hardware architecture diagram that shows aspects of an illustrative SDC 112 generated from program source code 102 in a multi-threaded imperative programming language that includes a language construct 302 that defines a function call 306. The construct 302 maps to a circuit implementation for implementing the function call 306 in hardware such as, for instance, the illustrative SDC 112 shown in FIG. 3A.

The construct 302 identifies the function call 306 and one or more input parameters for the function (referred to herein as "function parameters"). For example, in the source code sample shown in Table A, a function call 306 has been defined as "Z=G(X)", where X is the input parameter for the function "G."

TABLE A

```
Void F( ) {
  Int X = 1
  Int Y = 2
  Z = G(X)
  Return Y*Z }
```

As shown in FIG. 3A, the construct 302 also includes statements 304A that are located before the function call 306 in the program source code 102 and statements 304B that are located after the function call 306 in the program source code 102. In the source code sample shown in Table A, the statements "Int X=1" and "Int Y=2" are located before the function call 306 and the statement "Return Y*Z" is located after the function call 306. Other statements can be located prior to or after the function call 306. In this regard, it is to be appreciated that the construct 302 shown in Table A is merely illustrative and that the construct 302 can utilize a different syntax in other configurations.

The construct 302 maps to a circuit implementation that includes a first pipeline 200D, a second pipeline 200E, and a third pipeline 200F. The first hardware pipeline 200D can implement the statements 304A located before the function call 306 in the program source code 102. The first hardware pipeline 200D outputs variables to a variable queue 202C (which might be referred to herein as the "first queue" and outputs parameters for the function to a function parameters queue (which might be referred to herein as the "second queue").

Variables stored in a variable queue 202 are variables that have a value prior to a function call 306 and that are used after the function call 306. In the sample source code shown in Table A, the variable "Y" will be stored in a variable queue since it has a value prior to the function call 306 and is used after the function call in the statement "Return Y*Z." The variable "X" is not stored in a variable queue since it is not utilized after the function call 306.

The second hardware pipeline 200E in the circuit implementation corresponding to the function call construct 302 obtains function parameters from the function parameters queue 202D. The second hardware pipeline 200E also includes hardware for implementing the function itself. For example, the second hardware pipeline 200E might implement the function by performing operations on the function parameters and/or other values. In the sample source code shown in Table A, the function is "G( )", which takes one parameter, "X." The second hardware pipeline 200E stores results generated by performance of the function in a return queue 202E (which might be referred to herein as the "third queue").

The third hardware pipeline 200F in the circuit implementation for the function call construct 302 implements the statements 304B located after the function call 302 in the program source code 102. The third hardware pipeline 200F can retrieve the results generated by the second pipeline 200E from the return queue 202E. The third hardware pipeline 200F can also retrieve the variables stored in the variable queue 202C by the first hardware pipeline 200D. The third hardware pipeline 200F can perform hardware operations specified by the statements 304B using the variables and the results of the function. In the sample source code shown in Table A, the third pipeline 200F implements "Return Y*Z." As discussed above, Y is pushed on the variable queue 202C by the pipeline 200D and Z is the result of the function "G(X)" pushed on the return queue 202E by the second pipeline 200E.

Figure 3B:
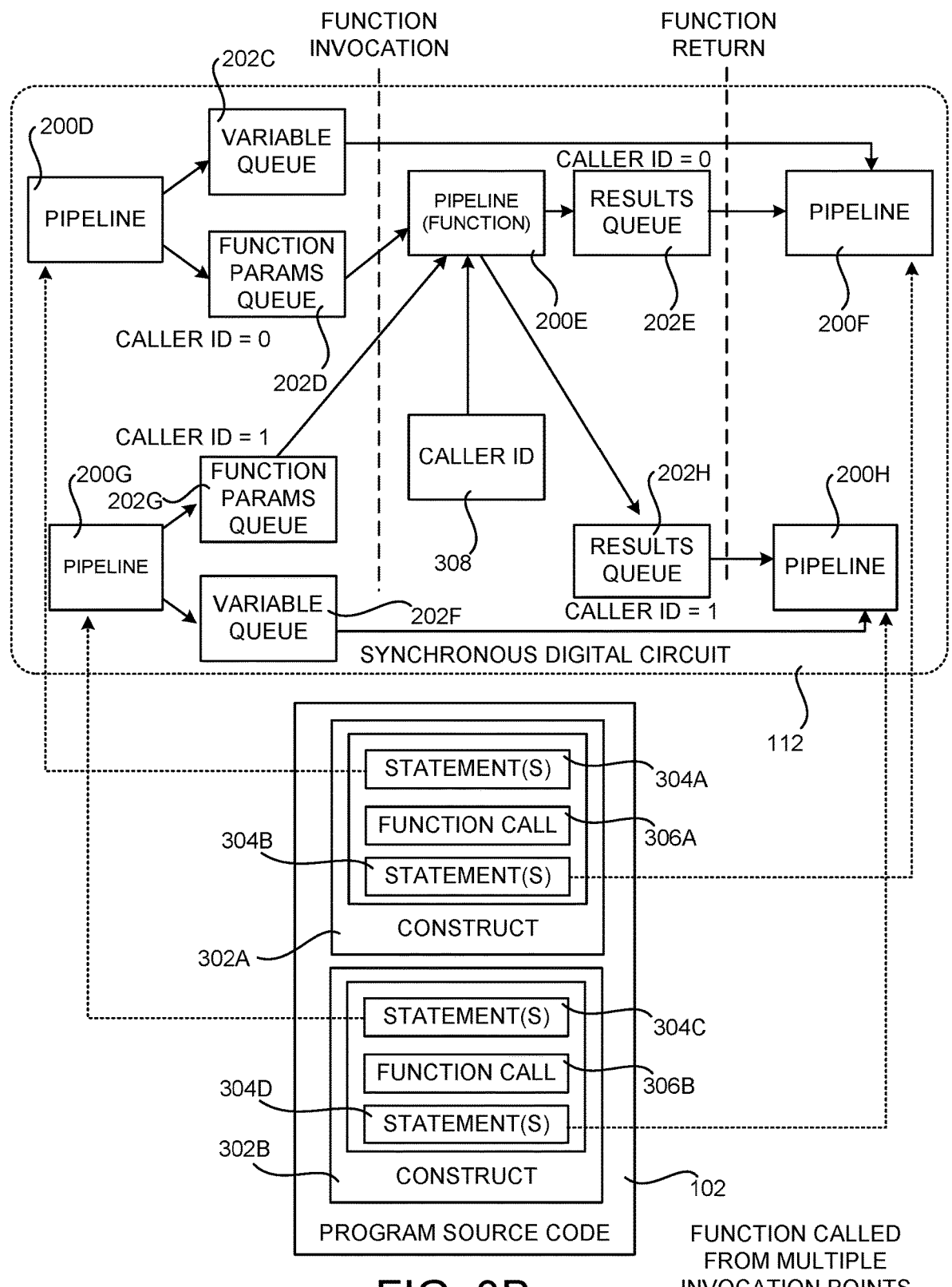
FIG. 3B is a hardware architecture diagram that shows aspects of an illustrative synchronous digital circuit generated from source code that includes a language construct that defines a function that is called from multiple locations within source code.

In the example shown in FIG. 3A, the function defined by the construct 302 is called from only a single location (i.e. the function call 306). It is possible, however, for calls to be made to a function from multiple locations within the program source code 102. FIG. 3B shows aspects of an illustrative SDC 112 generated from program source code 102 that includes a language construct 302 that defines a function that is called from multiple locations within the source code 102. The SDC 112 shown in FIG. 3B includes a single instance of hardware for implementing a function called from multiple locations in program source code 102.

As shown in FIG. 3B, the program source code 102 includes the statements 304A, the function call 306A, and the statements 304B as in the example shown in FIG. 3A and described above. The program source code 102 in the example shown in FIG. 3B also includes a second function call 306B to the same function as the function call 306A. The program source code also includes statements 304C located prior to the function call 306B and statements 304D located after the function call 306B in the program source code 102.

In order to implement the function call 306B, the SDC 112 includes a fourth hardware pipeline 200G. The fourth hardware pipeline 200G can implement the statements 304C located before the second function call 306B in the program source code 102.

The fourth hardware pipeline 200G outputs second variables to a second variable queue 202F (which might be referred to herein as the "fourth queue") and outputs second function parameters to a second function parameters queue 202G (which might be referred to herein as the "fifth queue.") In these configurations, the second hardware pipeline 200E (i.e. the pipeline implementing the function) can obtain the second function parameters from the second function parameters queue 202G and perform the specified function using the second function parameters. The second hardware pipeline 200E can then store the results of the function in a second results queue 202H (which might be referred to herein as the "sixth queue").

As shown in FIG. 3B, a fifth hardware pipeline 200H can implement the statements 304D located after the second function call 306B in the program source code 102. The fifth hardware pipeline 200H can retrieve the results generated by the second pipeline 200E from the second results queue 202H. The fifth hardware pipeline 200H can also retrieve the second variables stored by the fourth hardware pipeline 200G in the second variable queue 202F. The fifth hardware pipeline 200H can then perform operations specified by the program source code 102 using the second variables and the results of the function using the second function parameters.

In the configuration shown in FIG. 3B, the second hardware pipeline 200E can utilize a hidden parameter (i.e. a parameter that is not exposed to the programmer of the source code 102) to determine whether results are to be stored in the results queue 202E (i.e. for consumption by the third pipeline 200F) or the results queue 202H (i.e. for consumption by the fifth pipeline). The compiler 104 can automatically generate a circuit description for implementing the hidden parameter in the SDC 112.

In the example shown in FIG. 3B, the hidden parameter is shown as the "Caller ID." When the Caller ID=0, the pipeline 200E stores its results in the results queue 202E. When the Caller ID=1, the pipeline 200E stores its results in the results queue 202H.

Figure 4:
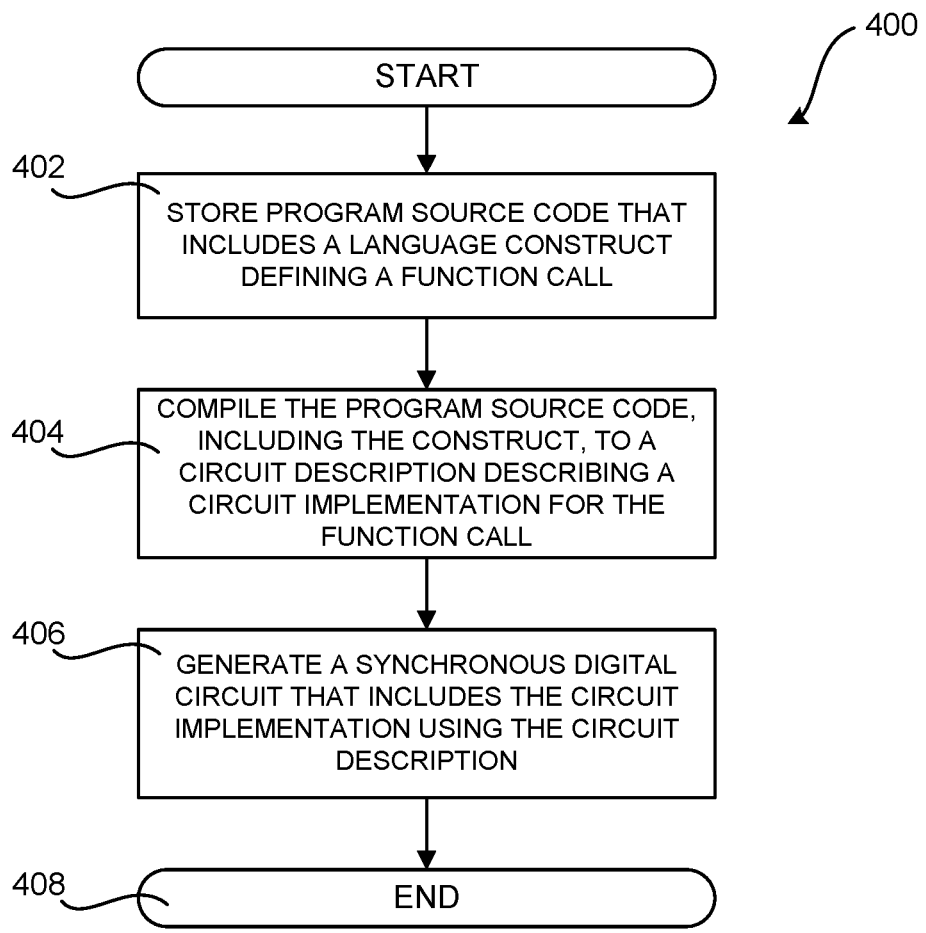
FIG. 4 is a flow diagram showing a routine that illustrates aspects of the operation of the technologies described with reference to FIGS. 1-3B for generating a synchronous digital circuit from source code that includes a language construct that defines a function call.

FIG. 4 is a flow diagram showing a routine 400 that illustrates aspects of the operation of the technologies described with reference to FIGS. 1-3B for generating a SDC 112 from source code 102 that includes a language construct 302 that defines a function call 306. It should be appreciated that the logical operations described herein with regard to FIG. 4, and the other FIGS., can be implemented (1) as a sequence of computer implemented acts or program modules running on a computing device and/or (2) as interconnected machine logic circuits or circuit modules within a computing device.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 400 begins at operation 402, where program source code 102 is defined and stored that includes a language construct 302 that defines a function call. From operation 402, the routine 400 proceeds to operation 404, where the compiler 104 compiles the program source code 102 to a circuit description for a SDL 112 for implementing the function call. As discussed above, the circuit description might be expressed as HDL code 106.

From operation 404, the routine 400 proceeds to operation 406, where the circuit description (e.g. HDL code) is utilized to generate an SDC 112 that includes the circuit implementation defined by the circuit description. The routine 400 then proceeds from operation 406 to operation 408, where it ends.

Figure 5:
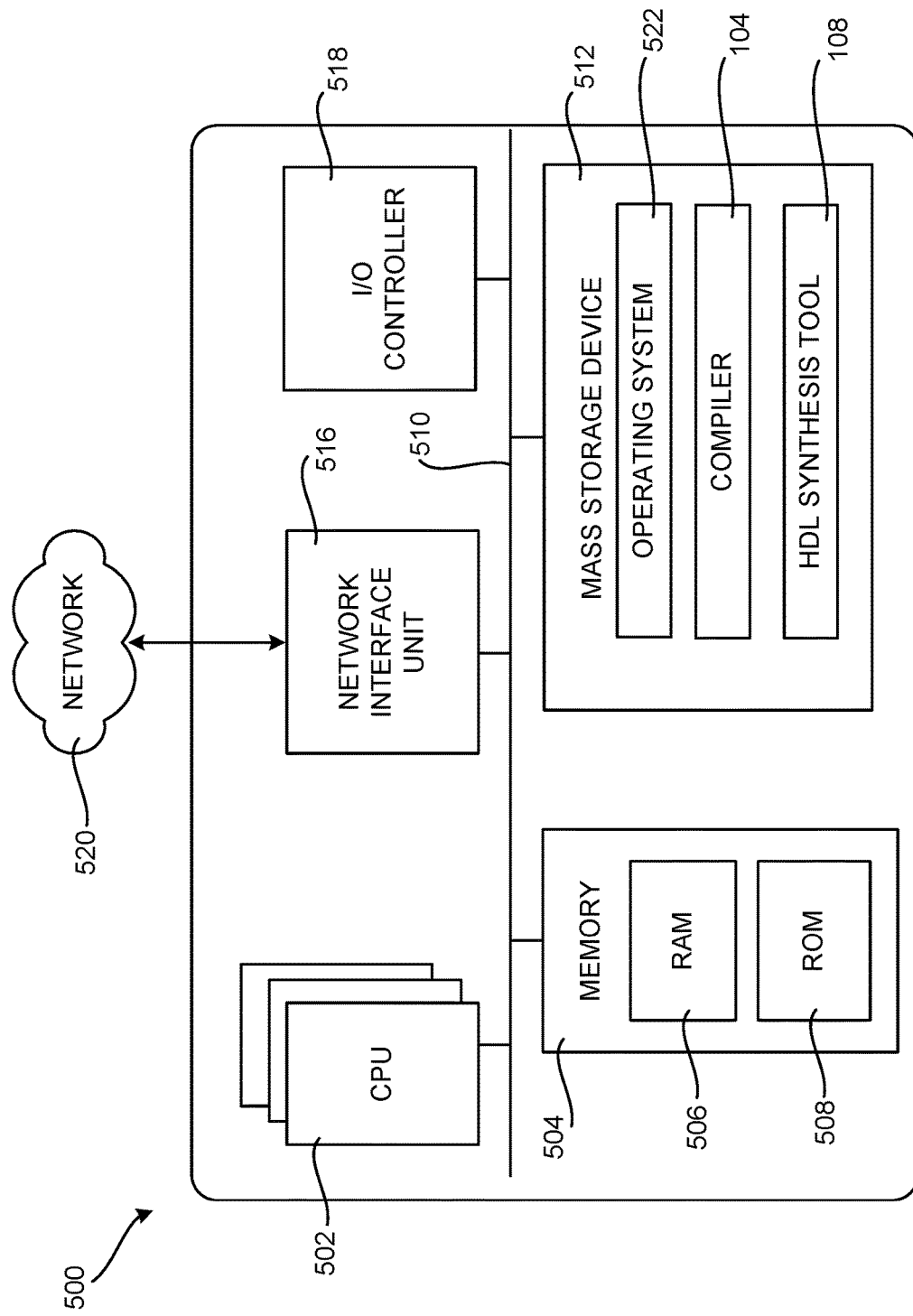
FIG. 5 is a computer architecture diagram showing an illustrative computer hardware and software architecture for a computing device that can implement aspects of the technologies presented herein.

FIG. 5 is a computer architecture diagram showing an illustrative computer hardware and software architecture for a computing device that can implement the various technologies presented herein. In particular, the architecture illustrated in FIG. 5 can be utilized to implement a server computer, mobile phone, an e-reader, a smartphone, a desktop computer, a tablet computer, a laptop computer, or another type of computing device.

The computer 500 illustrated in FIG. 5 includes a central processing unit 502 ("CPU"), a system memory 504, including a random-access memory 506 ("RAM") and a read-only memory ("ROM") 508, and a system bus 510 that couples the memory 504 to the CPU 502. A basic input/output system ("BIOS" or "firmware") containing the basic routines that help to transfer information between elements within the computer 500, such as during startup, can be stored in the ROM 508. The computer 500 further includes a mass storage device 512 for storing an operating system 522, application programs, and other types of programs, such as the compiler 104 and the HDL synthesis tool 108. The mass storage device 512 can also be configured to store other types of programs and data.

The mass storage device 512 is connected to the CPU 502 through a mass storage controller (not shown) connected to the bus 510. The mass storage device 512 and its associated computer readable media provide non-volatile storage for the computer 500. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 500.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 500. For purposes of the claims, the phrase "computer storage medium," and variations thereof, does not include waves or signals per se or communication media.

According to various configurations, the computer 500 can operate in a networked environment using logical connections to remote computers through a network such as the network 520. The computer 500 can connect to the network 520 through a network interface unit 516 connected to the bus 510. It should be appreciated that the network interface unit 516 can also be utilized to connect to other types of networks and remote computer systems. The computer 500 can also include an input/output controller 518 for receiving and processing input from a number of other devices, including a keyboard, mouse, touch input, an electronic stylus (not shown in FIG. 5), or a physical sensor such as a video camera. Similarly, the input/output controller 518 can provide output to a display screen or other type of output device (also not shown in FIG. 5).

It should be appreciated that the software components described herein, when loaded into the CPU 502 and executed, can transform the CPU 502 and the overall computer 500 from a general-purpose computing device into a special-purpose computing device customized to facilitate the functionality presented herein. The CPU 502 can be constructed from any number of transistors or other discrete circuit elements, which can individually or collectively assume any number of states. More specifically, the CPU 502 can operate as a finite-state machine, in response to executable instructions contained within the software modules disclosed herein. These computer-executable instructions can transform the CPU 502 by specifying how the CPU 502 transitions between states, thereby transforming the transistors or other discrete hardware elements constituting the CPU 502.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 500 in order to store and execute the software components presented herein. It also should be appreciated that the architecture shown in FIG. 5 for the computer 500, or a similar architecture, can be utilized to implement other types of computing devices, including hand-held computers, video game devices, embedded computer systems, mobile devices such as smartphones, tablets, and other types of computing devices known to those skilled in the art. It is also contemplated that the computer 500 might not include all of the components shown in FIG. 5, can include other components that are not explicitly shown in FIG. 5, or can utilize an architecture completely different than that shown in FIG. 5.

Figure 6:
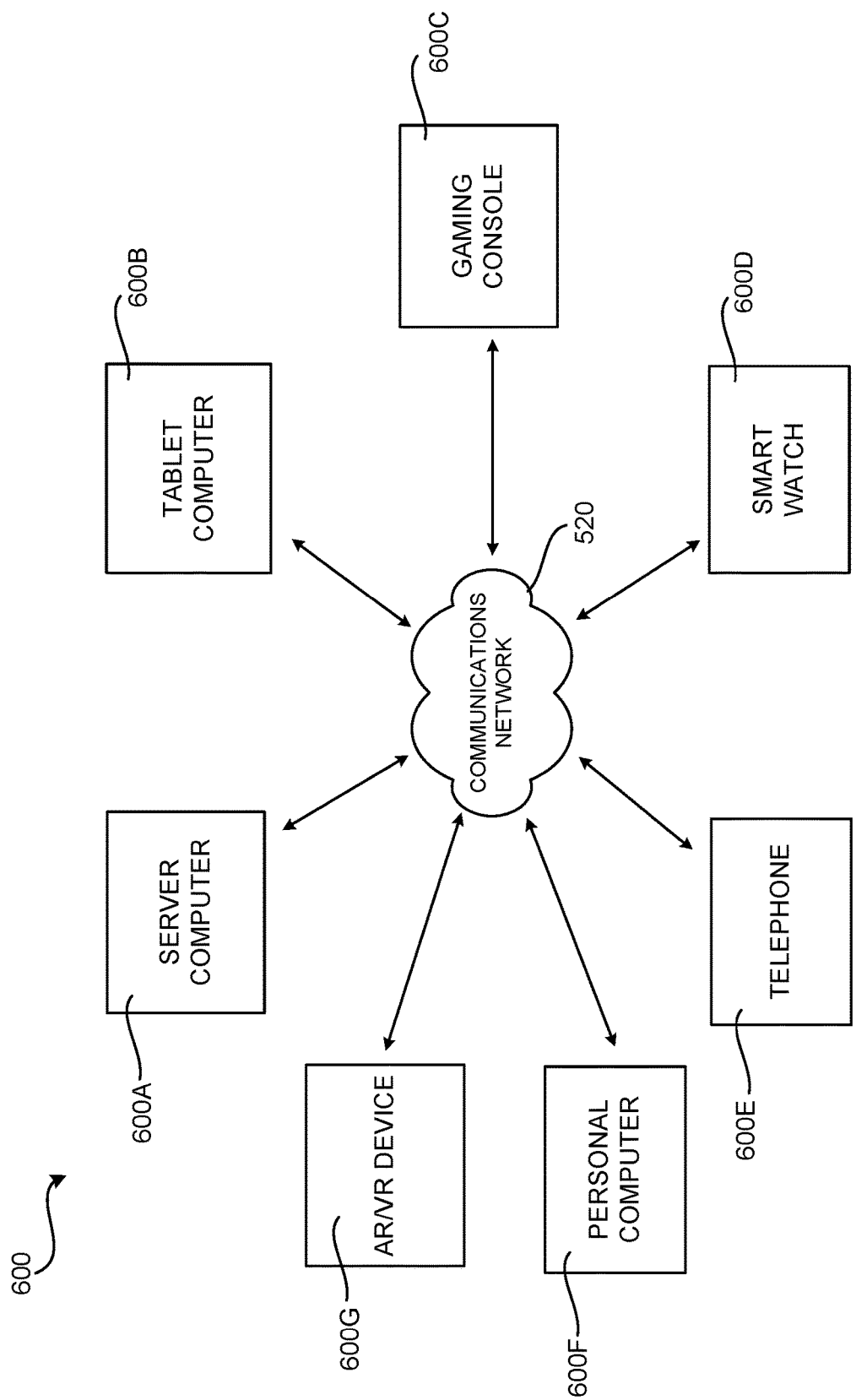
FIG. 6 is a network diagram illustrating a distributed computing environment in which aspects of the disclosed technologies can be implemented.

FIG. 6 is a network diagram illustrating a distributed network computing environment 600 in which aspects of the disclosed technologies can be implemented, according to various embodiments presented herein. As shown in FIG. 6, one or more server computers 600A can be interconnected via a communications network 520 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 600B, a gaming console 600C, a smart watch 600D, a telephone 600E, such as a smartphone, a personal computer 600F, and an AR/VR device 600G.

In a network environment in which the communications network 520 is the Internet, for example, the server computer 600A can be a dedicated server computer operable to process and communicate data to and from the client computing devices 600B-600G via any of a number of known protocols, such as, hypertext transfer protocol ("HTTP"), file transfer protocol ("FTP"), or simple object access protocol ("SOAP"). Additionally, the networked computing environment 600 can utilize various data security protocols such as secured socket layer ("SSL") or pretty good privacy ("PGP"). Each of the client computing devices 600B-600G can be equipped with an operating system operable to support one or more computing applications or terminal sessions such as a web browser (not shown in FIG. 6), or other graphical user interface (not shown in FIG. 6), or a mobile desktop environment (not shown in FIG. 6) to gain access to the server computer 600A.

The server computer 600A can be communicatively coupled to other computing environments (not shown in FIG. 6) and receive data regarding a participating user's interactions/resource network. In an illustrative operation, a user (not shown in FIG. 6) may interact with a computing application running on a client computing device 600B-600G to obtain desired data and/or perform other computing applications.

The data and/or computing applications may be stored on the server 600A, or servers 600A, and communicated to cooperating users through the client computing devices 600B-600G over an exemplary communications network 520. A participating user (not shown in FIG. 6) may request access to specific data and applications housed in whole or in part on the server computer 600A. These data may be communicated between the client computing devices 600B-600G and the server computer 600A for processing and storage.

The server computer 600A can host computing applications, processes and applets for the generation, authentication, encryption, and communication of data and applications, and may cooperate with other server computing environments (not shown in FIG. 6), third party service providers (not shown in FIG. 6), network attached storage ("NAS") and storage area networks ("SAN") to realize application/data transactions.

It should be appreciated that the illustrative computing architecture shown in FIG. 5 and the illustrative distributed network computing environment shown in FIG. 6 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1. A computer-implemented method, comprising: storing program source code in a multi-threaded imperative programming language, the program source code comprising a construct defining a function call; compiling the construct to a circuit description describing a circuit implementation, the circuit implementation comprising a first hardware pipeline configured to output one or more variables to a first queue and to output one or more function parameters to a second queue, a second hardware pipeline configured to receive the function parameters from the second queue, to perform one or more operations using the function parameters, and to store results generated by the one or more operations in a third queue, and a third hardware pipeline configured to obtain the variables from the first queue and to retrieve the results from the third queue; and generating, based on the circuit description, a synchronous digital circuit comprising the circuit implementation.

Clause 2. The computer-implemented method of clause 1, wherein the first hardware pipeline implements statements in the program source code located before the function call.

Clause 3. The computer-implemented method of any of clauses 1-2, wherein the third hardware pipeline implements statements in the program source code located after the function call.

Clause 4. The computer-implemented method of any of clauses 1-3, wherein the circuit implementation further comprises: a fourth hardware pipeline configured to output one or more second variables to a fourth queue and to output one or more second function parameters to a fifth queue, wherein the second hardware pipeline is further configured to receive the second function parameters from the fifth queue, to perform the one or more operations using the second function parameters, and to store results generated by the one or more operations in a sixth queue; and a fifth hardware pipeline configured to receive the variables from the fifth queue and to receive the results from the sixth queue.

Clause 5. The computer-implemented method of any of clauses 1-4, wherein second pipeline is further configured to receive a hidden parameter and to store the results in the third queue or the sixth queue based on the hidden parameter.

Clause 6. The computer-implemented method of any of clauses 1-5, wherein the construct identifies the function call and the one or more function parameters.

Clause 7. The computer-implemented method of any of clauses 1-6, wherein the synchronous digital circuit is implemented in a field-programmable gate array (FPGA), a gate array, or application-specific integrated circuit (ASIC).

Clause 8. The computer-implemented method of any of clauses 1-7, wherein a network interface card (NIC) is configured with the FPGA, gate array, or ASIC.

Clause 9. A synchronous digital circuit generated from program source code in a multi-threaded imperative programming language, the program source code comprising a construct defining a function call, the synchronous digital circuit comprising: a first hardware pipeline configured to output one or more variables to a first queue and to output one or more function parameters to a second queue; a second hardware pipeline configured to receive the function parameters from the second queue, to perform one or more operations using the function parameters, and to store results generated by the one or more operations in a third queue; and a third hardware pipeline configured to obtain the variables from the first queue and to retrieve the results from the third queue.

Clause 10. The synchronous digital circuit of clause 9, wherein the first hardware pipeline implements statements in the program source code located before the function call.

Clause 11. The synchronous digital circuit of any of clauses 9-10, wherein the third hardware pipeline implements statements in the program source code located after the function call.

Clause 12. The synchronous digital circuit of any of clauses 9-11, further comprising: a fourth hardware pipeline configured to output one or more second variables to a fourth queue and to output one or more second function parameters to a fifth queue, wherein the second hardware pipeline is further configured to receive the second function parameters from the fifth queue, to perform the one or more operations using the second function parameters, and to store results generated by the one or more operations in a sixth queue; and a fifth hardware pipeline configured to receive the variables from the fifth queue and to receive the results from the sixth queue.

Clause 13. The synchronous digital circuit of any of clauses 9-12, wherein second pipeline is further configured to receive a hidden parameter and to store the results in the third queue or the sixth queue based on the hidden parameter.

Clause 14. The synchronous digital circuit of any of clauses 9-13, wherein the synchronous digital circuit is implemented in a field-programmable gate array (FPGA), a gate array, or application-specific integrated circuit (ASIC).

Clause 15. The synchronous digital circuit of any of clauses 9-14, wherein a network interface card (NIC) is configured with the FPGA, gate array, or ASIC.

Clause 16. A computer, comprising: a central processing unit (CPU); and at least one computer storage medium storing program source code in a multi-threaded imperative programming language, the program source code comprising a construct defining a function call, and instructions, which when executed by the CPU, will cause the CPU to compile the program source code to a circuit description describing a circuit implementation, the circuit implementation comprising a first hardware pipeline configured to output one or more variables to a first queue and to output one or more function parameters to a second queue, a second hardware pipeline configured to receive the function parameters from the second queue, to perform one or more operations using the function parameters, and to store results generated by the one or more operations in a third queue, and a third hardware pipeline configured to obtain the variables from the first queue and to retrieve the results from the third queue.

Clause 17. The computer of clause 16, wherein the at least one computer storage medium stores further statements for generating the synchronous digital circuit from the circuit description.

Clause 18. The computer of any of clauses 16-17, wherein the circuit implementation further comprises: a fourth hardware pipeline configured to output one or more second variables to a fourth queue and to output one or more second function parameters to a fifth queue, wherein the second hardware pipeline is further configured to receive the second function parameters from the fifth queue, to perform the one or more operations using the second function parameters, and to store results generated by the one or more operations in a sixth queue; and a fifth hardware pipeline configured to receive the variables from the fifth queue and to receive the results from the sixth queue.

Clause 19. The computer of any of clauses 16-18, wherein second pipeline is further configured to receive a hidden parameter and to store the results in the third queue or the sixth queue based on the hidden parameter.

Clause 20. The computer of any of clauses 16-19, wherein the first hardware pipeline implements statements in the program source code located before the function call and wherein the third hardware pipeline implements statements in the program source code located after the function call.

Based on the foregoing, it should be appreciated that technologies for generating a SDC from a source code construct that defines a function call have been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A computer-implemented method, comprising:
storing program source code in a multi-threaded imperative programming language, the program source code comprising a construct defining a function call;
compiling the construct to a circuit description describing a circuit implementation, the circuit implementation comprising:
a first hardware pipeline configured to output one or more variables to a first queue and to output, to a second queue, one or more function parameters of the function call and a hidden parameter that identifies a third queue,
a second hardware pipeline configured to receive the function parameters and the hidden parameter from the second queue, to perform one or more operations using the function parameters, to determine to store results generated by the one or more operations in the third queue based on the hidden parameter, and to store the results generated by the one or more operations in the third queue, and
a third hardware pipeline configured to obtain the variables from the first queue and to retrieve the results from the third queue; and
generating, based on the circuit description, a synchronous digital circuit comprising the circuit implementation.

2. The computer-implemented method of claim 1, wherein the first hardware pipeline implements statements in the program source code located before the function call.

3. The computer-implemented method of claim 1, wherein the third hardware pipeline implements statements in the program source code located after the function call.

4. The computer-implemented method of claim 1, wherein the circuit implementation further comprises:
a fourth hardware pipeline configured to output one or more second variables to a fourth queue and to output, to a fifth queue, one or more second function parameters and a second hidden parameter that identifies a sixth queue, wherein the second hardware pipeline is further configured to receive the second function parameters and the second hidden parameter from the fifth queue, to perform the one or more operations using the second function parameters, to determine to store results generated by performing the one or more operations using the second function parameters in the sixth queue based on the second hidden parameter, and to store the results generated by the one or more operations performed using the second function parameters in the sixth queue; and
a fifth hardware pipeline configured to receive the variables from the fifth queue and to receive the results from the sixth queue.

5. The computer-implemented method of claim 1, wherein the construct identifies the function call and the one or more function parameters.

6. The computer-implemented method of claim 1, wherein the synchronous digital circuit is implemented in a field-programmable gate array (FPGA), a gate array, or application-specific integrated circuit (ASIC).

7. The computer-implemented method of claim 6, wherein a network interface card (NIC) is configured with the FPGA, gate array, or ASIC.

8. The computer-implemented method of claim 1, wherein the second hardware pipeline implements a function invoked by the function call, wherein the function call is one of a plurality of function calls to the function, wherein the third queue is one of a plurality of return value queues each of which stores results of the function for one of the plurality of function calls, and wherein determining to store results generated by the one or more operations in the third queue based on the hidden parameter comprises selecting one of the plurality of return value queues based on the hidden parameter.

9. The computer-implemented method of claim 8, wherein the third pipeline obtaining the results from the third queue comprises continuing execution after the function invoked by the function call has returned.

10. The computer-implemented method of claim 1, wherein the second hardware pipeline implements a function invoked by the function call, wherein the one or more variables comprise local variables, and wherein the first queue stores local variables of the first hardware pipeline for use by the third hardware pipeline after the function invoked by the function call has returned.

11. A synchronous digital circuit generated from program source code in a multi-threaded imperative programming language, the program source code comprising a construct defining a function call, the synchronous digital circuit comprising:
a first hardware pipeline configured to output one or more variables to a first queue and to output, to a second queue, one or more function parameters of the function call and a hidden parameter that identifies a third queue;
a second hardware pipeline configured to receive the function parameters and the hidden parameter from the second queue, to perform one or more operations using the function parameters, to determine to store results generated by the one or more operations in the third queue based on the hidden parameter, and to store the results generated by the one or more operations in the third queue; and
a third hardware pipeline configured to obtain the variables from the first queue and to retrieve the results from the third queue.

12. The synchronous digital circuit of claim 11, wherein the first hardware pipeline implements statements in the program source code located before the function call.

13. The synchronous digital circuit of claim 11, wherein the third hardware pipeline implements statements in the program source code located after the function call.

14. The synchronous digital circuit of claim 11, further comprising:
a fourth hardware pipeline configured to output one or more second variables to a fourth queue and to output, to a fifth queue, one or more second function parameters and a second hidden parameter that identifies a sixth queue, wherein the second hardware pipeline is further configured to receive the second function parameters and the second hidden parameter from the fifth queue, to perform the one or more operations using the second function parameters, to determine to store results generated by performing the one or more operations using the second function parameters in the sixth queue based on the second hidden parameter, and to store the results generated by the one or more operations performed using the second function parameters in the sixth queue; and
a fifth hardware pipeline configured to receive the variables from the fifth queue and to receive the results from the sixth queue.

15. The synchronous digital circuit of claim 11, wherein the synchronous digital circuit is implemented in a field-programmable gate array (FPGA), a gate array, or application-specific integrated circuit (ASIC).

16. The synchronous digital circuit of claim 15, wherein a network interface card (NIC) is configured with the FPGA, gate array, or ASIC.

17. A computer, comprising:
  a central processing unit (CPU); and
  at least one computer storage medium storing
    program source code in a multi-threaded imperative programming language, the program source code comprising a construct defining a function call, and
    instructions, which when executed by the CPU, will cause the CPU to compile the program source code to a circuit description describing a circuit implementation, the circuit implementation comprising
      a first hardware pipeline configured to output one or more variables to a first queue and to output, to a second queue, one or more function parameters of the function call and a hidden parameter that identifies a third queue,
      a second hardware pipeline configured to receive the function parameters and the hidden parameter from the second queue, to perform one or more operations using the function parameters, to determine to store results generated by the one or more operations in the third queue based on the hidden parameter, and to store the results generated by the one or more operations in the third queue, and
      a third hardware pipeline configured to obtain the variables from the first queue and to retrieve the results from the third queue.

18. The computer of claim 17, wherein the at least one computer storage medium stores further statements for generating the synchronous digital circuit from the circuit description.

19. The computer of claim 17, wherein the circuit implementation further comprises:
  a fourth hardware pipeline configured to output one or more second variables to a fourth queue and to output, to a fifth queue, one or more second function parameters and a second hidden parameter that identifies a sixth queue, wherein the second hardware pipeline is further configured to receive the second function parameters and the second hidden parameter from the fifth queue, to perform the one or more operations using the second function parameters, to determine to store results generated by performing the one or more operations using the second function parameters in the sixth queue based on the second hidden parameter, and to store results generated by the one or more operations performed using the second function parameters in the sixth queue; and
  a fifth hardware pipeline configured to receive the variables from the fifth queue and to receive the results from the sixth queue.

20. The computer of claim 17, wherein the first hardware pipeline implements statements in the program source code located before the function call and wherein the third hardware pipeline implements statements in the program source code located after the function call.

* * * * *